US010345418B2

(12) United States Patent
Wadell et al.

(10) Patent No.: US 10,345,418 B2
(45) Date of Patent: Jul. 9, 2019

(54) CALIBRATION DEVICE FOR AUTOMATIC TEST EQUIPMENT

(71) Applicant: Teradyne, Inc., North Reading, MA (US)

(72) Inventors: Brian C. Wadell, Reading, MA (US); Richard Pye, Burlington, MA (US)

(73) Assignee: Teradyne, Inc., North Reading, MA (US)

( * ) Notice: Subject to any disclaimer, the term of this patent is extended or adjusted under 35 U.S.C. 154(b) by 139 days.

(21) Appl. No.: 14/947,370

(22) Filed: Nov. 20, 2015

(65) Prior Publication Data

US 2017/0146632 A1    May 25, 2017

(51) Int. Cl.
| | |
|---|---|
| *G01R 31/02* | (2006.01) |
| *G01R 31/26* | (2014.01) |
| *G01R 31/28* | (2006.01) |
| *G01R 31/40* | (2014.01) |
| *G01R 1/067* | (2006.01) |

(Continued)

(52) U.S. Cl.
CPC ....... *G01R 35/005* (2013.01); *G01R 1/07342* (2013.01); *G01R 31/2834* (2013.01); *G01R 31/3191* (2013.01)

(58) Field of Classification Search
CPC ........ G01R 31/26; G01R 31/28; G01R 31/31; G01R 35/00; G01R 31/02; G01R 31/40; G01R 1/067; G01R 1/073; G06F 19/00; G01B 7/02
See application file for complete search history.

(56) References Cited

U.S. PATENT DOCUMENTS

| | | |
|---|---|---|
| 4,864,077 A | 9/1989 | Wadell |
| 4,894,753 A | 1/1990 | Wadell et al. |

(Continued)

FOREIGN PATENT DOCUMENTS

WO    WO-02/075343 A1    9/2002

OTHER PUBLICATIONS

Rytting, D., Network Analyzer Error Models and Calibration Methods, Agilent Technologies, Presentation, 51 pages (2003).

(Continued)

*Primary Examiner* — Neel D Shah
(74) *Attorney, Agent, or Firm* — Choate, Hall & Stewart LLP

(57) ABSTRACT

Example automatic test equipment (ATE) includes: a test instrument for outputting test signals to test a device under test (DUT), and for receiving response signals based on the test signals; a device interface board (DIB) connected to the test instrument, with the DIB including an application space having a site to which the DUT connects, and with the test signals and the response signals passing the site; and calibration circuitry in the application space on the DIB. The calibration circuitry includes a communication interface over which communications pass, with the communications comprising control signals to the calibration circuitry and measurement signals from the calibration circuitry. The calibration circuitry also includes non-volatile memory to store calibration data and is controllable, based on the control signals, to pass the test signals from the test instrument to the DUT and to pass the response signals from the DUT to the test instrument.

24 Claims, 5 Drawing Sheets

(51) Int. Cl.
  *G01R 1/073*  (2006.01)
  *G01R 35/00*  (2006.01)
  *G01B 7/02*  (2006.01)
  *G06F 19/00*  (2018.01)
  *G01R 31/319*  (2006.01)

(56) References Cited

U.S. PATENT DOCUMENTS

| | | | |
|---|---|---|---|
| 5,359,237 A | 10/1994 | Pye | |
| 5,471,136 A | 11/1995 | Pye | |
| 5,572,160 A | 11/1996 | Wadell | |
| 5,615,219 A | 3/1997 | Keating et al. | |
| 6,066,953 A | 5/2000 | Wadell | |
| 6,204,813 B1 | 3/2001 | Wadell et al. | |
| 6,275,962 B1* | 8/2001 | Fuller | G01R 31/31724 714/724 |
| 6,288,561 B1* | 9/2001 | Leedy | G01R 1/07307 257/E21.511 |
| 6,504,395 B1 | 1/2003 | Johnson | |
| 9,735,779 B1* | 8/2017 | Perisetty | H03K 19/00369 |
| 9,755,766 B2 | 9/2017 | Wadell et al. | |
| 9,786,977 B2 | 10/2017 | Lyons et al. | |
| 10,048,304 B2 | 8/2018 | King et al. | |
| 2003/0085726 A1* | 5/2003 | Rutten | G01R 31/2886 324/750.02 |
| 2005/0079822 A1* | 4/2005 | Boose | G01R 31/31709 455/67.11 |
| 2006/0082358 A1* | 4/2006 | Conner | G01R 1/07342 324/756.03 |
| 2006/0222062 A1 | 10/2006 | Kadota | |
| 2006/0269278 A1* | 11/2006 | Kenoyer | F16M 11/10 396/428 |
| 2008/0191683 A1* | 8/2008 | Mayder | G01R 31/31924 324/73.1 |
| 2009/0128162 A1 | 5/2009 | Singleton et al. | |
| 2013/0080107 A1 | 3/2013 | Flores, Jr. et al. | |
| 2013/0102091 A1 | 4/2013 | King et al. | |
| 2014/0253099 A1* | 9/2014 | Han | G01R 19/00 324/126 |
| 2017/0146632 A1 | 5/2017 | Wadell et al. | |
| 2017/0163358 A1 | 6/2017 | Wadell et al. | |
| 2017/0170537 A1 | 6/2017 | Lyons et al. | |

OTHER PUBLICATIONS

International Search Report for PCT/US16/47976, 3 pages (dated Oct. 21, 2016).
Written Opinion for PCT/US16/47976, 5 pages (dated Oct. 21, 2016).
International Preliminary Report on Patentability for PCT/US2016/047976, 6 pages (dated May 22, 2018).

* cited by examiner

CALIBRATION DEVICE FOR AUTOMATIC TEST EQUIPMENT

TECHNICAL FIELD

This specification relates generally to a calibration device for use in automatic test equipment (ATE).

BACKGROUND

Automatic test equipment (ATE) includes electronics for sending signals to, and receiving signals from, a device under test (DUT) in order to test the operation of the DUT. The ATE includes test instruments, such as microwave instruments, which are calibrated for operation. Test instruments may be calibrated for power, noise, impedance, or other parameters at a specific connector near to the input or output of the instrument. This location is called the calibration plane, and is the location to which test instrument performance is specified or known.

An instrument's calibration plane is most often physically and electrically different from the optimal calibration plane, which lies at the DUT pin or ball. Solutions have been implemented to extend the instrument calibration plane towards the DUT, and thereby reduce the length of the path between the calibration plane and the DUT. These solutions include adding a fixed offset gain/attenuation, characterizing the intervening interconnects (the device interface board—DIB) and calculating appropriate adjustments, developing calibration standards in the DUT package that can be used to calculate adjustments, or adjusting the parameter until a desired result is achieved. Each of these solutions has trade-offs in complexity, accuracy (and thus yield), time-to-market, and cost-of test-limitations when applied to real-time measurements. Overall design of the calibration of the path between the actual calibration plane and the DUT can affect signal performance, which can affect the accurate operation of the instrument and thus device yield and cost.

SUMMARY

Example automatic test equipment (ATE) comprises: a test instrument for outputting test signals to test a device under test (DUT), and for receiving response signals based on the test signals; a device interface board (DIB) connected to the test instrument, with the DIB comprising an application space having a site to which the DUT connects, and with the test signals and the response signals passing through the site; and calibration circuitry in the application space on the DIB. The calibration circuitry comprises a communication interface over which communications pass. The communications comprise control signals to the calibration circuitry and measurement signals from the calibration circuitry. The calibration circuitry also comprises non-volatile memory to store calibration data and is controllable, based on the control signals, to pass the test signals from the test instrument to the DUT and to pass the response signals from the DUT to the test instrument. The example ATE may include one or more of the following features, either alone or in combination.

The DIB may comprise sites or pins, and the calibration circuitry may be placed adjacent to the sites or pins and may be used to calibrate the test instrument that is not adjacent to the sites or pins. The calibration circuitry may comprise a splitter, combiner, or circuitry that is controllable to pass test signals to DUTs, and to pass response signals from the DUTs. The calibration circuitry may comprise a temperature detector to detect a temperature at the calibration circuitry, with at least one of the measurement signals representing the temperature detected. The calibration circuitry may comprise a signal power detector to detect a signal power of at least one of the test signals or the response signals, with at least one of the measurement signals representing the signal power detected. The power detector may be configured to use a reference signal for self-calibration. The calibration circuitry may be isolated electromagnetically.

The calibration circuitry may comprise switch circuitry, along with a short circuit, an open circuit, and a known impedance load circuit, with the switch circuitry being controllable to send the test signals to at least one of the short circuit, the open circuit, or the known impedance load circuit and to receive reflected signals from the at least one of the short circuit, the open circuit, or the known impedance load circuit. The calibration circuitry may comprise a verification circuit having a specific calibration, with the switch circuitry being controllable to send the test signals to the verification circuit to verify S-parameters determined based on reflected signals from the at least one of the short circuit, the open circuit, the known impedance load circuit, or an impedance standard.

The ATE may comprise a test computer for orchestrating testing of the DUT; and a controller to interface between the test computer and the calibration circuitry. The controller may be for receiving data from the test computer and for generating the control signals to the calibration circuitry based on the data, and also for correcting test instrument sourced and/or measured signals based on one or more parameters obtained at the calibration circuitry, and also for reading stored data from the calibration circuitry and a state of the calibration circuitry. The calibration circuitry may comprise impedance that is tunable based on the control signals and information derived by the calibration and the test instrument.

The calibration circuitry may comprise memory storing calibration data, with the calibration data being specific to the calibration circuitry. The calibration circuitry may comprise at least two switches connected in series.

The calibration circuitry may comprise: a first switch that is controllable to receive the test signals from the test instrument and to output the test signals, and to receive the response signals and to pass the response signals to the test instrument; a second switch in series with the first switch, with the second switch being controllable to receive the test signals output by the first switch and to send the test signals to the DUT, and to receive the response signals from the DUT and to output the response signals to the first switch; and a third switch in series with the first switch, with the third switch being controllable to receive the test signals from the first switch and to send the test signals to one or more of a short circuit, an open circuit, an impedance load circuit, and impedance for determining s-parameter calibration. The calibration circuitry may comprise a power detector. The first switch may be controllable to pass the test signals to the power detector. An output of the power detector may be a basis for at least one of the measurement signals.

The calibration circuit may comprise an attenuator or programmable attenuator in a signal path along which test signals pass. The calibration circuit may comprise an amplifier or a programmable gain amplifier in a signal path along which test signals pass. The calibration circuitry may comprise a power divider or splitter circuit in series with the first switch. The power divider or splitter circuit may be configured to receive the test signals and to send the test signals to the DUT, and to receive the response signals from the DUT and to output the response signals.

The calibration circuitry may comprise: a switch that is controllable to receive the test signals from the test instrument and to output the test signals, and to receive the response signals and to pass the response signals to the test instrument; and a power detector. The switch may be controllable to pass the test signals to the power detector. An output of the power detector may be a basis for at least one of the measured calibration signals.

Signals passing through the calibration circuit may comprise single ended, differential signals or a conversion of differential to-single-ended signals or single-ended to differential signals.

Example ATE may comprise: a test instrument for outputting test signals to test a device under test (DUT), and for receiving response signals based on testing of the DUT a probe card in communication with the test instrument, with the probe card comprising probes that are configured to contact the DUT, and with the test signals and the response signals passing through the probes; and calibration circuitry on the probes or probe card. The calibration circuitry may comprise a communication interface over which communications pass. The communications may comprise control signals to the calibration circuitry and measurement signals from the calibration circuitry. The calibration circuitry may be controllable, based on the control signals, to pass the test signals from the test instrument to the DUT and to pass the response signals from the DUT to the test instrument. The example ATE may include one or more of the following features, either alone or in combination.

In a case that the calibration circuitry is on the probes, the calibration circuitry may comprise a three-dimensional (3D) structure having circuit paths that are surrounded by air or other dielectric comprising a signal path to or from the probes. The ATE may comprise memory to store calibration standards that are measured at low frequency and used to derive high frequency characteristics of the calibration standards.

Any two or more of the features described in this specification, including in this summary section, can be combined to form implementations not specifically described herein.

The test systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The test systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features and advantages will be apparent from the description and drawings, and from the claims.

DESCRIPTION OF THE DRAWINGS

Like reference numerals in different figures indicate like elements.

DETAILED DESCRIPTION

Described herein are example calibration devices for use with ATE. The example calibration devices are configured for placement near to the DUT, and may be configured to calibrate power, noise, impedance, or other parameters. In example implementations, the calibration devices can be positioned in an application space containing a DUT site connection, on probes or cards that contact the DUT, or at any other appropriate location beyond the output interface of a test instrument. The calibration device can be used to calibrate signals up to the location of its placement, effectively moving the calibration plane from near to the test instrument output to the location of the calibration device, and thereby reducing the length of the path between the calibration plane and the DUT. Generally, the closer that the calibration plane comes to the DUT, the greater confidence there will be in the accuracy of signals that reach the DUT. Accordingly, it may be advantageous to locate the calibration device as close to the DUT as possible, taking into account technical considerations, including the size of the calibration device.

Figure 1:
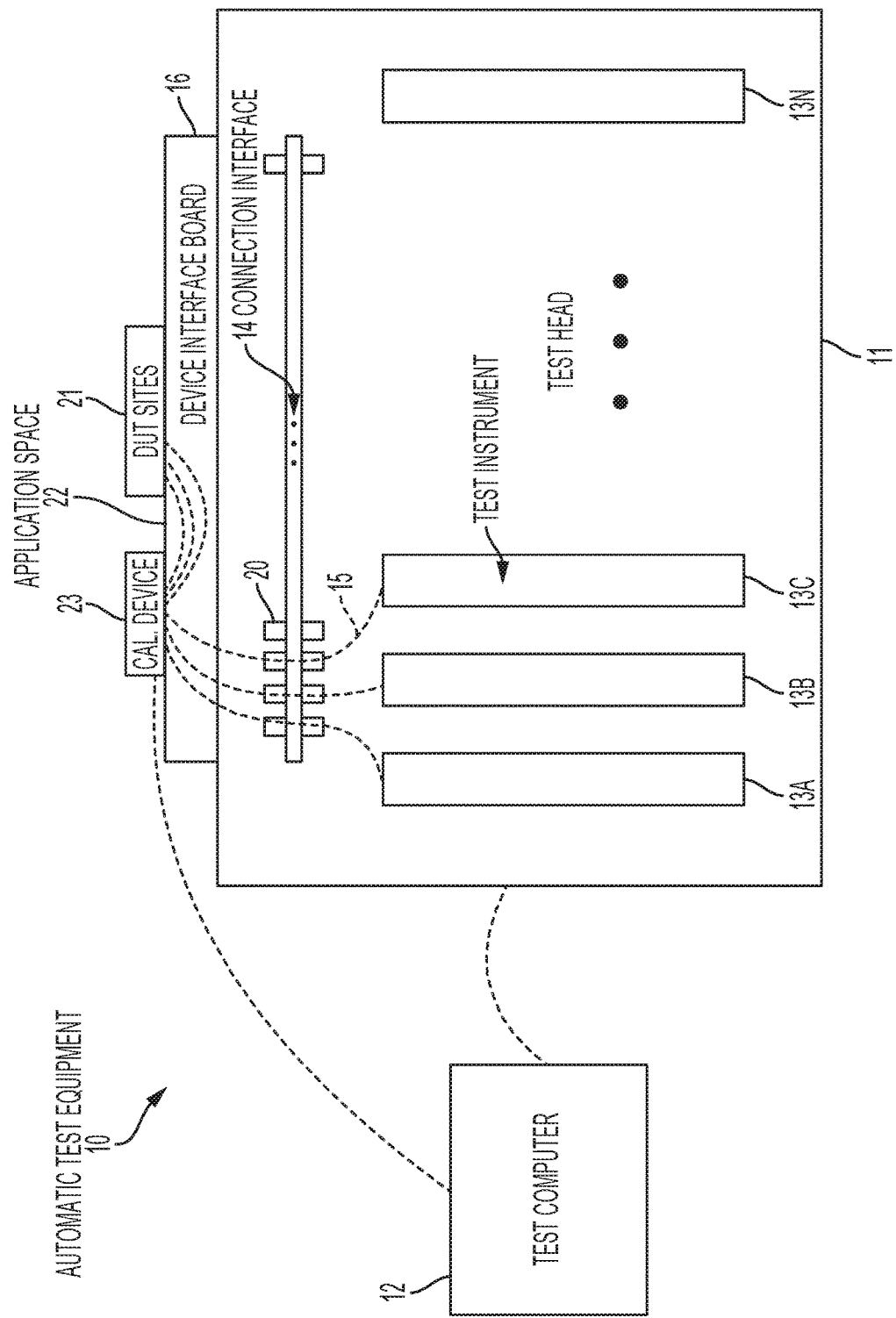
FIG. 1 is a block diagram of an example test system.

FIG. 1 shows components of example ATE 10 in which the calibration device may be used. Notably, however, the calibration device is not limited to use with the ATE of FIG. 1 or to use with the DUTs described herein, but rather may be used in any appropriate technical context, including outside of a testing environment. In FIG. 1, the dashed lines indicate potential signal paths between devices.

ATE 10 includes a test head 11 and a test computer 12. Test head 11 interfaces to the DUTs (not shown) on which tests are performed, and test computer 12 communicates with test head 11 to control testing. For example, test computer may download test program sets to test instruments on the test head, which then run the test program sets to test DUTs in communication with the test head. The calibration device described herein may be used with the test configuration of FIG. 1; however, its use is not limited to this, or to any specific, test configuration.

ATE 10 includes test instruments 13A to 13N. In this example, one or more of the test instruments are microwave test instruments for performing radio frequency (RF) tests, among other tests, on corresponding DUTs. However, other types of test instruments may be used in lieu of, or in addition to, microwave test instruments. Each test instrument may be configured to output test signals to test a DUT, and to receive signals from the DUT. The signals received may include response signals that are based on the test signals and/or signals that originate from the DUT that are not prompted by (e.g., are not in response to) test signals.

ATE 10 includes a connection interface 14, which connects test instrument outputs 15 to a DIB 16. Connection interface 14 may include connectors 20 or other devices for routing signals between the test instruments and DIB 16. For example, the connection interface may include one or more circuit boards or other substrates on which such connectors are mounted. Other types of connections may be used. Heretofore, connection interface 14 was the calibration plane to which signals from the test instrument were calibrated (e.g., had known values or other characteristics). The calibration device described herein moves the calibration plane closer to the DUT than the connection interface and, therefore, increases the length of the signal path over which the signals have reliable values or other characteristics.

In the example of FIG. 1, DIB 16 connects, electrically and mechanically, to test head 11. The DIB includes sites 21, which may include pins, traces, or other points of electrical and mechanical connection to which DUTs may connect. Test signals, response signals, and other signals pass over the sites between the DUT and test instruments. DIB 16 also includes, among other things, connectors, conductive traces, and circuitry for routing signals between the test instruments, DUTs connected to sites 21, and other circuitry. The part of the DIB on which such connectors, circuits, and/or sites reside is referred to as the application space 22. In some implementations, the application space may be adjacent to, and on the same plane as, sites 21. For example, the application space may be immediately adjacent to the sites. In some implementations, the application space may be in another appropriate location between the connection at interface 14 and the actual DUT. For example, the application space may be above or below the top plane of DIB 16. For example, the application space may be on the underside of DIB 16. For example, the space may be close to the probes.

In some implementations, a calibration device 23 is adjacent to the sites. Calibration device 23 may be relatively small, e.g., on the order of 25 mm×25 mm or less in surface area, although the calibration device is not limited to these dimensions, and may also be larger than 25 mm×25 mm. Calibration device 23 is configured to calibrate signals from a test instrument that is not adjacent to the sites or pins. In some implementations, signals between the test instruments and the DUTs that relate to testing pass through the calibration device.

In this context, calibration includes, but is not limited to, identifying signal characteristics at the location of the calibration device, and instructing the test instrument to vary its output based, at least in part, on those signal characteristics. For example, if an output signal from a test instrument 13A is controlled to +1 decibel (dB), and the calibration device measures the actual level at the remote path location to be −2 dB, then the path loss between the test instrument and the calibration device is determined to be 3 dB. Accordingly, the test instrument may be instructed to increase its output signal power by 3 dB (or make other corrections in the instrument or path) in order to produce the intended +1 dB signal at the output of the calibration device. Calibration also includes, but is not limited to, identifying signal characteristics at the location of the calibration device, and changing those signal characteristics on the calibration device itself based, e.g., on stored data, calibration standards, or instructions from the test computer or other external source so that the signals output from the calibration device to the DUT(s) have the intended values or characteristics. The calibration standards may be measured at low frequency and the values used, by the controller, to derive high frequency characteristics of the calibration standards. The high frequency calibration standards may be used to control operation of the calibration device.

In this context, the terms high or higher and low or lower are relative do not have any particular numerical connotations. For RF signals for example, in some implementations, the higher frequency signals have frequencies that meet or exceed 50 MHz, and the lower frequency signals have frequencies that are less than 50 MHz; in some implementations, the higher frequency signals have frequencies that meet or exceed 6 GHz, and the lower frequency signals have frequencies that are less than 6 GHz; in some implementations, the higher frequency signals have frequencies that meet or exceed 20 GHz, and the lower frequency signals have frequencies that are less than 20 GHz; in some implementations, the higher frequency signals have frequencies that meet or exceed 60 GHz, and the lower frequency signals have frequencies that are less than 60 GHz; and so forth.

In some implementations, calibration device 23 is located in the application space 22 adjacent to the sites, thereby effectively moving the calibration plane to the application space. In some implementations, the calibration device is implemented on an integrated circuit (IC) or multichip module (MCM) having appropriate circuitry and on-board memory for storing calibration and other data. However, other appropriate construction technology may be used in addition to, or in lieu of, an IC or MCM. For example, a PCB or hybrid integrated circuit might be used. The calibration device includes one or more test signal interfaces, over which test and other signals to/from the DUT may be transmitted, and a control signal interface, over which other signals, such as signals relating to operation, control, and measurements on the calibration device, may be transmitted.

In some implementations, the calibration device includes calibration circuitry that is isolated electromagnetically from other circuitry in the application space. The calibration circuitry includes the communication interfaces noted above, namely the test signal interface and the control signal interface. The calibration circuitry also includes one or more switches, one or more splitters, one or more combiners, and/or switch circuitry that is controllable to pass test signals to DUTs in the sites, and to pass response signals or other signals from the DUTs to the test instruments, as described herein. The calibration circuitry also includes memory (e.g., non-volatile memory) to store calibration and other data that may be used to calibrate signals on the device or for reporting to a test instrument or the test computer. The calibration circuitry also includes a controller to control operation of the calibration device.

Figure 2:
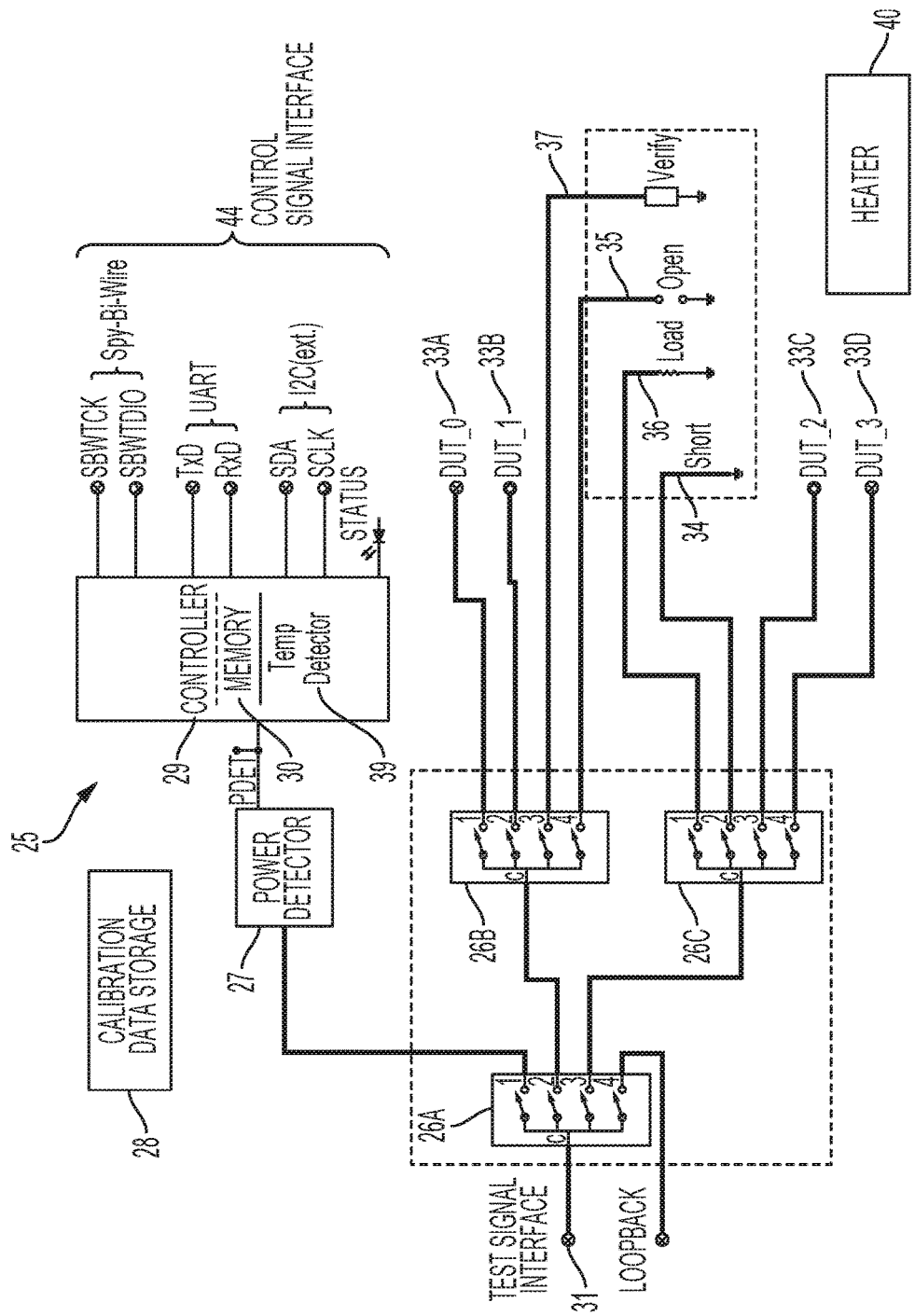
FIG. 2 is a block diagram of an example calibration device that may be used in the test system of FIG. 1.

FIG. 2 shows an example implementation 25 of calibration device 23 that may be mounted in the application space of a DIB, such as DIB 16. Component parts of calibration device 25 include, but are not limited to, switches 26A, 26B, 26C, power detector 27, storage 28 for storing calibration data and standards, a controller 29 for controlling operation of the circuitry, memory 30, which may or may not be part of the controller, and a temperature detector 39, which may or may not be part of the controller, along with various ports and impedances. In some implementations, the switches may have a different configuration than that shown, and there may be a different number of switches. Controller 29 may include one or more processing devices that are programmed to control operation of the switches and other circuitry in the calibration device. Control may be implemented based, e.g., on data stored in memory on the device and/or based on signals received over the control interface to calibrate signals on the device itself and/or to calibrate test instruments based on information obtained at the device. Controller may communicate with a test computer via control signal interface 44, which may include multiple signal lines, as shown, to support exchange of information with the test computer.

In the example implementation of FIG. 2, test signals from a test instrument, such as test instrument 13A, arrive at test signal interface 31 of device 25. In this example, first switch 26A is controllable (e.g., in response to signals output by the controller) to receive those test signals and to output the test signals to additional switches, and to receive response (or other) signals from those additional switches and to pass those signals back to the test instrument.

In this example, the additional switches include a second switch 26B, which is in series with first switch 26A. Second switch 26B implements multiplexer functionality and is controllable (e.g., in response to signals output by the controller) to receive the test signals output by the first switch, and to selectively output the test signals out to one or more DUTs over appropriate signal path(s) 33A, 33B. Second switch 26B is also controllable to receive response (or other) signals from one or more DUTs over an appropriate signal path(s) 33A, 33B and to route those response (or other) signals back to the first switch for subsequent transmission to the test instrument. In this example, second switch 26B is also controllable to route signals to test circuits, which include open circuit 35 and verify circuit 37.

In this example, the additional switches include a third switch 26C, which is in series with first switch 26A. Third switch 26C implements multiplexer functionality and is controllable (e.g., in response to signals output by the controller) to receive the test signals output by the first switch, and to selectively output the test signals out to one or more DUTs over appropriate signal path(s) 33C, 33D. Third switch 26C is also controllable to receive response (or other) signals from one or more DUTs over an appropriate signal path(s) 33C, 33D and to route those response (or other) signals back to the first switch for subsequent transmission to the test instrument. In this example, third switch 26C is also controllable to route signals to test circuits, which include short circuit 34 and load circuit 36.

Above, the test circuits include, but are not limited to, short circuit 34, open circuit 35, impedance load circuit 36, and verification circuit 37 having a known impedance for S-parameter calibration. In operation, the switches are controllable to send the test signals to one or more of the short circuit, the open circuit, the known impedance, or the verification circuit, and to receive reflected signals from the short circuit, the open circuit, the known impedance load circuit, or the verification circuit. Circuitry in the test instrument or test computer, such as a vector analyzer, measures signals to the calibration device, and signals reflected from these test circuits in order to confirm calibration and to determine S-parameters.

As noted above, calibration device 25 includes controller 29 to control operation of the calibration device. Controller 29 is also configured (e.g., programmed) to act as interface between test computer 12 and the calibration circuitry. For example, controller 29 may be configured to receive data from the test computer and to generate control signals to control the calibration circuitry based on that data. The controller is also configured to correct test instrument sourced and/or measured signals based on one or more parameters obtained at the calibration device. The control and corrections may be implemented using data stored in memory 30 and states of the signals at the calibration device, and by controlling the calibration circuitry accordingly based on the data and the states. For example, the controller may control the switches or other circuitry on the calibration device affect signal timing, signal level, or other appropriate signal characteristics to achieve a desired (e.g., calibrated) signal output. Probe calibration standards stored in memory may also be accessible to controller 29 and used to calibrate signals passing through the calibration device, as appropriate.

Calibration device 25 also includes a temperature detector 39. Temperature detector 39 is configured to detect a temperature at the calibration circuitry, and to output one or more measurement signals representing the detected temperature. The measurement signals may be output to controller 29 for reporting to the test computer, or the signals may be output directly from the temperature detector to the test computer. Information about temperature close to the DUT may affect various signal characteristics, and may be used for calibration or other purposes.

Calibration device 25 also may include a signal power detector 27 to detect the power of signals (test signals, response signals, or other signals) passing through the calibration device. In the example implementation of FIG. 2, the power detector generates one or more measurement signals representing the detected signal power, and outputs the signal power to either the controller (for subsequent output to the test computer) or to the test computer directly. The signal power may be used to alter test instrument output, as appropriate, for calibration or other purposes. In some implementations, the signal power detector is configured for use as a reference signal to enable self-calibration of the calibration device.

In some implementations, calibration device 25 may include one or more heating devices 40 and/or cooling devices (e.g., a Peltier device) in order to implement on-device temperature control. Operation of the heating and/or cooling devices may be controlled, as appropriate by controller 29 monitoring the temperature detector 39 and controlling the heaters 40. Temperature control is implemented to stabilize the performance of the calibration circuitry when the surrounding environment changes. Temperature sensitive components can be stabilized by keeping them at their original calibration temperature, by setting the temperature to a known temperature for a brief time, by stepping the circuit through a thermal calibration, or by offsetting RF power changes in the circuitry.

Figure 3:
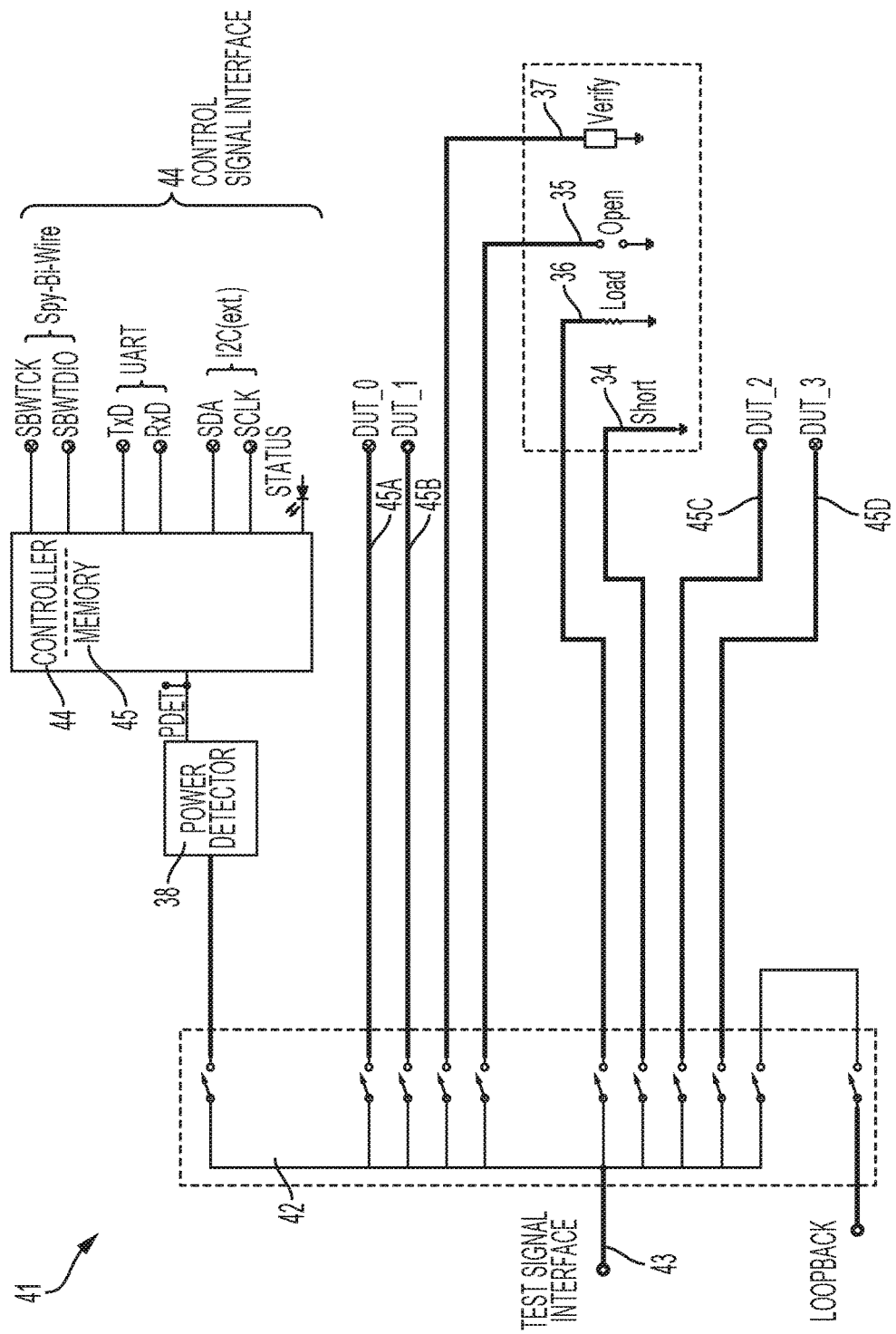
FIG. 3 is a block diagram of an example calibration device that may be used in the test system of FIG. 1.

FIG. 3 shows another example implementation 41 of calibration device 23. This implementation services a single DUT pin, and does not multiplex test signals as does the implementation of FIG. 2. Consequently, in some cases, the implementation of FIG. 3 may be made smaller in size than the implementation of FIG. 2. The component parts of calibration device 41 include, but are not limited to, switch 42, power detector 38, controller 44, and memory 45 for storing, among other data, calibration data and impedance standards. The controller may also include a temperature detector, as in the implementation of FIG. 1 Other components, such as those shown in FIG. 2, may also be included in calibration device 41. Calibration device 41 may be less than 25 mm×25 mm in area, for example. In other implementations, the calibration device may be less than 20 mm×20 mm, less than 15 mm×15 mm, less than 10 mm×10 mm, and so forth.

In this example, the calibration device 41 includes switch 42 connected to a test signal interface 43, over which signals to/from the DUT are transmitted, and one or more control signal interfaces 44, over which signals for operation, control, and measurements of the calibration device are transmitted. Switch 42 is controlled by controller 44 to send signals received from test interface 43 over output channels 45A to 45D to one or more DUTS, and to send signals received from the output channels over test interface 43. As noted, these latter signals may be responsive to the test signals, or they may be output by a DUT independent of the test signals.

Switch 42 is also controllable, by controller 44, to send test signals to test circuits 34, 35, 36, and 37, as described above Signals sent to ground may be reflected back, and used by the test instrument, test computer, or other appropriate circuitry to determine signal characteristics.

Switch 42 is also controllable, by controller 44, to send test signals to power detector 43. Power detector 43 is configured to detect signal peak or RMS power or peak or RMS or peak-to-peak voltage, sample the signal, etc., and to report the resulting measurement signal to controller 44 via an analog-to-digital controller (ADC), which may be either external (discrete) or embedded in the microcontroller. As described herein, controller 44 may report this information to the test computer, which may use that information to control other aspects of the test system, and to generate calibration data for storage on calibration device 41. Controller 44 may also receive temperature information from power detector 43 and output that information. In some implementations, the implementation of FIG. 3 may include a power reference (not shown), that is switchably connected to the power detector. In some implementations, the power reference provides a baseline against which signal power is compared by the power detector.

Figure 4:
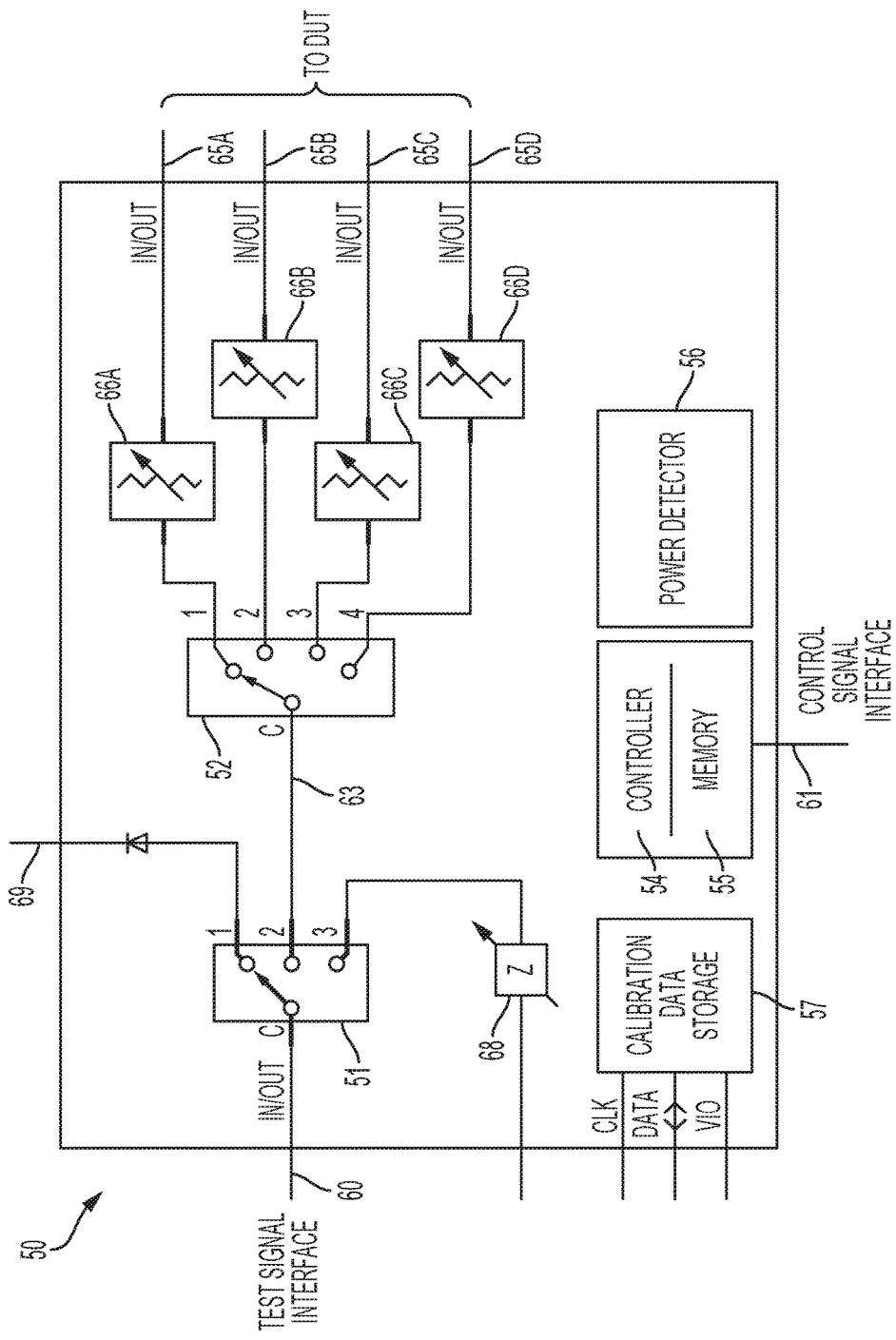
FIG. 4 is a block diagram of an example calibration device that may be used in the test system of FIG. 1.

FIG. 4 shows another example implementation 50 of calibration device 23 showing a 1:3 switch followed by a 1:4 switch. In this example, calibration device 50 includes first switch 51 and second switch 52 in series with first switch 51. Calibration device 50 also includes controller 54, memory 55 (which may be either internal or external to the controller), power detector 56, and storage 57, which operate as described above with respect to FIGS. 2 and 3. Other components, such as those shown in FIGS. 2 and 3, may also be included in calibration device 41. Calibration device 50 may be on the order of 25 mm×25 mm or less, as described above.

First switch 51 is connected to a test signal interface 60, over which signals to/from the DUT are transmitted. Controller 54 is connected to one or more control signal interfaces 61, over which signals for operation, control, and measurements on the calibration device are transmitted. First switch 60 is controlled by controller 54 to send signals received from test interface 60 over circuit path 63, and to send signals received from circuit path 63 over test interface 60. As noted, these latter signals may be responsive to the test signals, or they may be output by a DUT independent of the test signals. As shown in FIG. 4, signals pass between first switch 51 and second switch 52 over path 63.

Second switch 52 is controlled by controller 54 to output signals from the first switch along one of four signal paths 65A, 65B, 65C, 65D to a DUT in a site 21, or to receive a signal from a signal path and to output that signal to first switch 52 (which outputs the signal over test interface 60). In this example, each path 65A, 65B, 65C, 65D may include an attenuator or programmable attenuator 66A, 66B, 66C, 66D to control signal levels, as appropriate. Controller 54 may control the attenuation in the case of a programmable attenuator based on calibration data and/or standards stored, e.g., in memory 55 on the calibration device or based on signals received over a control interface 61 from, e.g., a test computer. Adjusting the amount of attenuation in each path may enable independent equalization or control over signal power. Other signal adjusting circuitry may also be included in the signal paths.

First switch 51 may also be controlled to output the test signals to an impedance circuit 68 that is tunable by the controller based on, e.g., external control signals and/or information derived by the calibration and the test instrument. The output of impedance circuit 68 may be sent back to a test instrument, the test computer, or other appropriate circuitry for used determining signal characteristics.

First switch 51 also be controlled to output the test signals along a signal path 69 to external circuitry, such as the test computer, test instrument, or the like, without significant modification and/or to receive signals from that signal path.

FIGS. 2 and 4 show implementations of the calibration device having four multiplexer positions; and FIG. 3 shows an implementation of the calibration device depicting an implementation with a single 1:10 switch rather than a cascade of 1:4 switches as shown in FIG. 2. In some implementations, the calibration device may have a bidirectional arrangement. Other switching arrangements can be used to trade-off performance, e.g., to improve loss or isolation, while achieving comparable functionality. The input/output switching may terminate unused ports or reflect unused ports (e.g., a port at channel 47 of FIG. 3). A loopback path may be included in the calibration device for self-test or self-calibration. A radio frequency (RF) power reference may be included in the calibration device for use in calibrating the power detector RF signal characteristics, and reporting that information to the controller. A noise source may be included in the calibration device, along with its stored calibration data, for introducing noise into signals. The noise source may be accessed and controlled by the controller, as appropriate. Temperature sensing and stabilization in the form of heating, cooling, insulation or some combination may be used to improve device stability. The device may be mounted in a shield or otherwise provided with isolation from external, interfering signals.

In some implementations, the calibration device employs, as part of the calibration, insulation and active thermal stabilization along with temperature dependent calibration data. For example, the temperature coefficients of resistors used in the circuit. In some implementations, the calibration device includes a port for connection of external test equipment.

In some implementations, the calibration device employs impedance standards, which are not OSLT (Open-Short-Load-Thru) standards that are appropriate to the operating frequency range of a test instrument being calibrated. In the implementation of FIG. 2, open, short, load are used for impedance standards. In the implementation of FIG. 4, a tunable impedance is used to create impedances spread across the Smith Chart. In other implementations, the impedance standards could be offset shorts, TRL (Thru, Reflect, Line), or other appropriate impedance sets. In some implementations, a single known, tunable impedance may be used in place of three or more switched impedance standards. In some implementations, one or more calibration standards are measured at DC and the results are used to derive a high frequency model of the calibration standard. Two examples of this include, e.g., (i) measuring the load resistor accurately at DC and over temperature removing a major error term even at high frequency, and (ii) using a dc reference to set an AC power reference that can be used to calibrate the level detector. DC is traceable and accurately determined in the system using existing system resources.

In some implementations, tunable impedances (e.g., shunt capacitors) may be incorporated on the DUT side (e.g., the output paths) of the calibration device to match the calibration device impedance to the DUT impedance during testing.

In some implementations, the output multiplexer (e.g., switch 26B of FIG. 2) may be replaced with a power divider or splitter circuit. For example, in FIGS. 2 and 4, switches 26B or 52 may be replaced with one or more power divider or splitter circuits to control signal output to/from the signal paths to the DUT.

In some implementations, a high power termination or attenuator may be incorporated in one or more output signal paths to reduce high power signals. In some implementations, active or passive amplification might be incorporated into one or more output signal paths to increase signal power or to reduce noise.

In some implementations, the calibration device may include a differential signal path or a differential to single-ended transformation on one or more ports. For example, the differential signal path or a differential to single-ended transformation may be incorporated onto the control signal port and/or test signal port.

Figure 5:
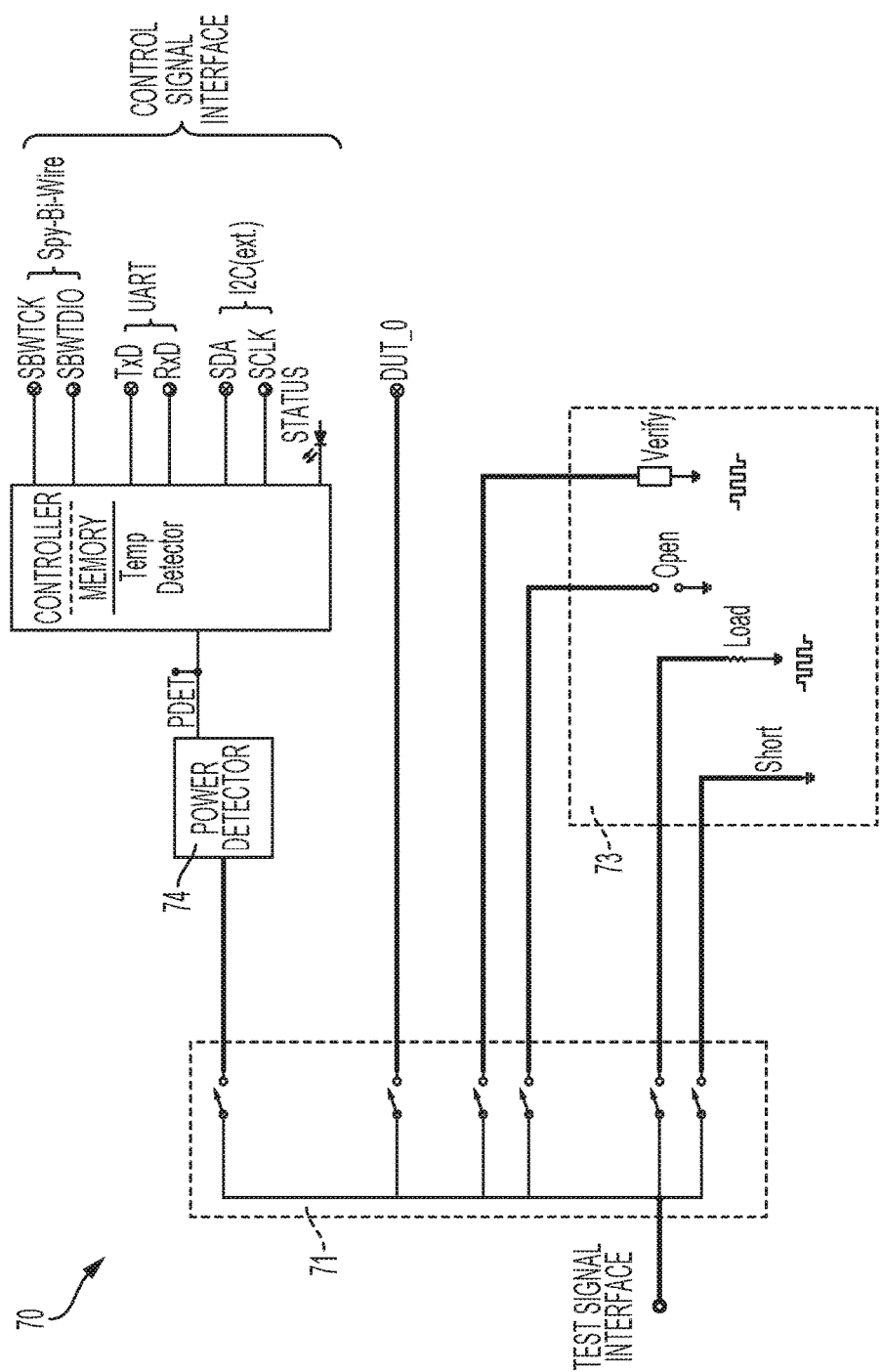
FIG. 5 is a block diagram of an example calibration device that may be used in the test system of FIG. 1.

FIG. 5 shows another example implementation 70 of calibration device 23 having no multiplexer positions (e.g., a single output). In this example, calibration device 50 includes a single switch 71, which provides a single output 72 to the DUT, along with outputs to test circuits 73, and power detector 74. Except for not having multiple DUT outputs, the components of implementation 70 operate in a manner similar to those same components in FIGS. 1 to 4.

As described above, the calibration device may be placed in the application space, which is nearer to the DUT than connection interface 14 (FIG. 1). In some implementations, the calibration device may be made even smaller than is described above. For example, the entire circuit may be fabricated using integrated circuit techniques to reduce the size significantly. For example, three-dimensional (3D) processes, such as 3D printing or other types of additive or subtractive manufacturing techniques, may be used to produce a calibration device of the type described herein using conductors surrounded by air (or other appropriate) dielectric that have one or more low-loss signal paths between to and from the probes. The resulting calibration device may be made with increased performance and also smaller. As a result, the calibration device may be placed even closer to the DUT than the application space. For example, the calibration device (examples of which are shown in FIGS. 2, 3, 4, and 5) may be placed at or near the tip of probe used for testing.

For example, in some implementations, the test system may include a probe card in communication with the test instrument. The probe card includes probes that are configured to contact the DUT such that test signals, response signals, control, and other signals pass through the probes. The probes get smaller as the point of contact to the DUT is approached. The calibration device/circuitry may be incorporated on the probe itself, either at the tip, near the tip, or on the probe card. The calibration device/circuitry may have any appropriate features described herein, except those features may be implemented on a smaller scale. The calibration device may be incorporated as part of the DUT wafer design in an area not occupied by DUTs. The calibration device may be located and used as part of a periodic probe tip cleaning and calibration process that compensates for wear.

In summary, the calibration device described herein may be implemented in a relatively small package that can be placed relatively close to the DUT. As a result, signals levels at or near the DUT can be known and controlled. The calibration device features are integrated into, and controlled by system software, so it appears to the user as if a calibrated instrument is at the output/input of the calibration device. Signal errors may be removed automatically through, e.g., adjustments to the signal path or mathematically in the test instrument.

Since the calibration device is after the instrument-DIB mating plane (the connection interface), the calibration device may be configured to remove errors due to non-repeatable mating of DIB boards, thus enhancing calibration. The calibration device may also improve copy-to-copy repeatability of the tester and DIB.

In the case of microwave instruments, those instruments are calibrated for all levels and frequencies that they can generate, which is a superset of all integrated circuit (IC) requirements. However, a specific IC and pin will use only a small percentage of those levels and frequencies. Since the calibration device is on the DIB and assigned to a specific IC pin with a subset of requirements, the calibration device may be calibrated for a specific set of amplitudes and frequencies appropriate to the pin to which the calibration device is assigned.

Any of the features of the implementations of FIGS. 2 to 4 may be combined, as appropriate, to produce alternative implementations.

While this specification describes example implementations related to "testing" and a "test system," the devices and methods described herein may be used in any appropriate system, and are not limited to test systems or to the example test systems described herein.

Testing, including control over the manipulator, performed as described herein may be implemented and/or controlled using hardware or a combination of hardware and software. For example, a test system like the ones described herein may include various controllers and/or processing devices located at various points. A central computer may coordinate operation among the various controllers or processing devices. The central computer, controllers, and processing devices may execute various software routines to effect control and coordination of testing and calibration.

Testing, including control over the manipulator, can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing and calibration can be performed by one or more programmable processors executing one or more computer programs to perform the functions described herein. All or part of the testing and calibration can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass PCBs for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a wired or wireless connection that includes intervening components but that nevertheless allows electrical signals to flow between connected components. Any "connection" involving electrical circuitry mentioned herein, unless stated otherwise, includes an electrical connection and not necessarily a direct physical connection regardless of whether the word "electrical" is used to modify "connection". Any "connection" between structural components as used herein may imply a direct physical connection or a physical connection that includes intervening one or more intervening components or other structures.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein

What is claimed is:

1. Automatic test equipment (ATE) comprising:
   a test instrument for outputting test signals to test a device under test (DUT) and for receiving response signals based on the test signals;
   a device interface board (DIB) connected to the test instrument, the DIB comprising an application space having a site to which the DUT connects, the test signals and the response signals to pass through the site; and
   calibration circuitry in the application space on the DIB and separate from the test instrument, the calibration circuitry comprising a communication interface over which communications pass, the communications comprising control signals to the calibration circuitry and characteristic signals from the calibration circuitry that represent test signal characteristics at a location of the calibration circuitry, the calibration circuitry comprising non-volatile memory to store calibration data and being controllable, based on the control signals, to pass the test signals from the test instrument to the DUT and to pass the response signals from the DUT to the test instrument;
   wherein the test instrument is configured to generate the calibration data based on the characteristic signals.

2. The ATE of claim 1, wherein the DIB comprises sites or pins, and the calibration circuitry is placed adjacent to the sites or pins.

3. The ATE of claim 1, wherein the calibration circuitry comprises a splitter, a combiner, or circuitry that is controllable to pass the test signals to DUTs, and to pass the response signals from the DUTs.

4. The ATE of claim 1, wherein the calibration circuitry comprises a temperature detector to detect a temperature at the calibration circuitry and to output a measurement signal representing the temperature detected.

5. The ATE of claim 1, wherein the calibration circuitry comprises a signal power detector to detect a signal power of at least one of the test signals or the response signals and to output a characteristic signal representing the signal power detected.

6. The ATE of claim 5, wherein the signal power detector is configured to use a reference signal for self-calibration.

7. The ATE of claim 1, wherein the calibration circuitry is isolated electromagnetically from other circuitry in the application space.

8. The ATE of claim 1, wherein the calibration circuitry comprises switch circuitry, and wherein the calibration circuitry further comprises a short circuit, an open circuit, and a known impedance load circuit, the switch circuitry being controllable to send the test signals to at least one of the short circuit, the open circuit, or the known impedance load circuit and to receive reflected signals from the at least one of the short circuit, the open circuit, or the known impedance load circuit.

9. The ATE of claim 8, wherein the calibration circuitry further comprises a verification circuit having a specific calibration, the switch circuitry being controllable to send the test signals to the verification circuit to verify S-parameters determined based on reflected signals from the at least one of the short circuit, the open circuit, or the known impedance load circuit, or based on an impedance standard.

10. The ATE of claim 1, further comprising:
    a test computer for orchestrating testing of the DUT; and
    a controller to interface between the test computer and the calibration circuitry, the controller for receiving data from the test computer and for generating the control signals to the calibration circuitry based on the data, the controller also for correcting test instrument sourced and/or measured signals based on one or more characteristic signals obtained from the calibration circuitry, the controller for reading stored data from the calibration circuitry and a state of the calibration circuitry.

11. The ATE of claim 1, wherein the calibration circuitry comprises impedance that is tunable based on the control signals and information derived by the calibration circuitry and the test instrument.

12. The ATE of claim 1, wherein the calibration data is specific to the calibration circuitry.

13. The ATE of claim 1, wherein the calibration circuitry comprises at least two switches connected in series.

14. The ATE of claim 1, wherein the calibration circuitry comprises:
    a first switch that is controllable to receive the test signals from the test instrument and to output the test signals, and to receive the response signals and to pass the response signals to the test instrument;
    a second switch in series with the first switch, the second switch being controllable to receive the test signals output by the first switch and to send the test signals to the DUT, and to receive the response signals from the DUT and to output the response signals to the first switch; and
    a third switch in series with the first switch, the third switch being controllable to receive the test signals from the first switch and to send the test signals to one or more of a short circuit, an open circuit, an impedance load circuit, or impedance for determining s-parameter calibration.

15. The ATE of claim 14, wherein the calibration circuitry comprises a power detector, and wherein the first switch is controllable to pass the test signals to the power detector, an output of the power detector being a basis for at least one measurement signal.

16. The ATE of claim 1, wherein the calibration circuit comprises an attenuator or programmable attenuator in a signal path along which the test signals pass.

17. The ATE of claim 1, wherein the calibration circuit comprises an amplifier or a programmable gain amplifier in a signal path along which the test signals pass.

18. The ATE of claim 1, wherein the calibration circuitry comprises:
    a power divider or splitter circuit in series with a first switch, the power divider or splitter circuit being configured to receive the test signals and to send the test signals to the DUT, and to receive the response signals from the DUT and to output the response signals.

19. The ATE of claim 1, wherein the calibration circuitry comprises:
    a switch that is controllable to receive the test signals from the test instrument and to output the test signals, and to receive the response signals and to pass the response signals to the test instrument; and
    a power detector, wherein the switch is controllable to pass the test signals to the power detector, an output of the power detector being a basis for at least one of the characteristic signals.

20. The ATE of claim 1, wherein signals passing through the calibration circuit comprise single ended, differential signals or a conversion of differential to single-ended signals or single-ended to differential signals.

21. Automatic test equipment (ATE) comprising:
    a test instrument for outputting test signals to test a device under test (DUT) and for receiving response signals based on the test signals;
    a device interface board (DIB) connected to the test instrument, the DIB comprising an application space having a site to which the DUT connects, the test signals and the response signals to pass through the site; and
    calibration circuitry in the application space on the DIB and separate from the test instrument, the calibration circuitry comprising a communication interface over which communications pass, the communications comprising control signals to the calibration circuitry and measurement signals from the calibration circuitry, the calibration circuitry comprising non-volatile memory to store calibration data and being controllable, based on the control signals, to pass the test signals from the test instrument to the DUT and to pass the response signals from the DUT to the test instrument;
    wherein the calibration circuitry comprises switch circuitry, a short circuit, an open circuit, and a known impedance load circuit, the switch circuitry being controllable to send the test signals to at least one of the short circuit, the open circuit, or the known impedance load circuit and to receive reflected signals from the at least one of the short circuit, the open circuit, or the known impedance load circuit; and
    wherein the calibration circuitry further comprises a verification circuit having a specific calibration, the switch circuitry being controllable to send the test signals to the verification circuit to verify S-parameters determined based on reflected signals from the at least one of the short circuit, the open circuit, or the known impedance load circuit, or based on an impedance standard.

22. Automatic test equipment (ATE) comprising:
    a test instrument for outputting test signals to test a device under test (DUT) and for receiving response signals based on the test signals;
    a device interface board (DIB) connected to the test instrument, the DIB comprising an application space having a site to which the DUT connects, the test signals and the response signals to pass through the site;
    calibration circuitry in the application space on the DIB and separate from the test instrument, the calibration circuitry comprising a communication interface over which communications pass, the communications comprising control signals to the calibration circuitry and measurement signals from the calibration circuitry, the calibration circuitry comprising non-volatile memory to store calibration data and being controllable, based on the control signals, to pass the test signals from the test instrument to the DUT and to pass the response signals from the DUT to the test instrument;
    a test computer for orchestrating testing of the DUT; and
    a controller to interface between the test computer and the calibration circuitry, the controller for receiving data from the test computer and for generating the control signals to the calibration circuitry based on the data, the controller also for correcting test instrument sourced and/or measured signals based on one or more parameters obtained at the calibration circuitry, the controller for reading stored data from the calibration circuitry and a state of the calibration circuitry.

23. Automatic test equipment (ATE) comprising:
    a test instrument for outputting test signals to test a device under test (DUT) and for receiving response signals based on the test signals;
    a device interface board (DIB) connected to the test instrument, the DIB comprising an application space having a site to which the DUT connects, the test signals and the response signals to pass through the site;
    calibration circuitry in the application space on the DIB and separate from the test instrument, the calibration circuitry comprising a communication interface over which communications pass, the communications comprising control signals to the calibration circuitry and measurement signals from the calibration circuitry, the calibration circuitry comprising non-volatile memory to store calibration data and being controllable, based on the control signals, to pass the test signals from the test instrument to the DUT and to pass the response signals from the DUT to the test instrument;
    wherein the calibration circuitry comprises:
        a first switch that is controllable to receive the test signals from the test instrument and to output the test signals, and to receive the response signals and to pass the response signals to the test instrument;
        a second switch in series with the first switch, the second switch being controllable to receive the test signals output by the first switch and to send the test signals to the DUT, and to receive the response signals from the DUT and to output the response signals to the first switch; and
        a third switch in series with the first switch, the third switch being controllable to receive the test signals from the first switch and to send the test signals to one or more of a short circuit, an open circuit, an impedance load circuit, or impedance for determining s-parameter calibration.

24. Automatic test equipment (ATE) comprising:
a test instrument for outputting test signals to test a device under test (DUT) and for receiving response signals based on the test signals;
a device interface board (DIB) connected to the test instrument, the DIB comprising an application space having a site to which the DUT connects, the test signals and the response signals to pass through the site;
calibration circuitry in the application space on the DIB and separate from the test instrument, the calibration circuitry comprising a communication interface over which communications pass, the communications comprising control signals to the calibration circuitry and measurement signals from the calibration circuitry, the calibration circuitry comprising non-volatile memory to store calibration data and being controllable, based on the control signals, to pass the test signals from the test instrument to the DUT and to pass the response signals from the DUT to the test instrument;
wherein the calibration circuitry comprises a power divider or splitter circuit in series with a first switch, the power divider or splitter circuit being configured to receive the test signals and to send the test signals to the DUT, and to receive the response signals from the DUT and to output the response signals.

* * * * *